United States Patent [19]

Lundberg

[11] Patent Number: 5,313,118
[45] Date of Patent: May 17, 1994

[54] HIGH-SPEED, LOW-NOISE, CMOS OUTPUT DRIVER

[75] Inventor: James R. Lundberg, Austin, Tex.

[73] Assignee: Digital Equipment Corporation, Maynard, Mass.

[21] Appl. No.: 909,549

[22] Filed: Jul. 6, 1992

[51] Int. Cl.$^5$ .................. H03K 19/003; H03K 19/094
[52] U.S. Cl. ..................................... 307/451; 307/270; 307/443; 307/475
[58] Field of Search ............... 307/263, 270, 443, 572, 307/475

[56] References Cited

U.S. PATENT DOCUMENTS

| | | | |
|---|---|---|---|
| 4,782,250 | 11/1986 | Adams et al. | 307/473 |
| 4,797,579 | 1/1993 | Lewis | 307/443 |
| 4,963,766 | 10/1990 | Lundberg | 307/451 |

FOREIGN PATENT DOCUMENTS 4-180409 6/1993 Japan .

*Primary Examiner*—William L. Sikes
*Assistant Examiner*—Shawn Riley
*Attorney, Agent, or Firm*—Richard J. Paciulan; Denis Maloney

[57] ABSTRACT

A driver circuit employs an N-channel pull-down transistor of relatively small size, directly connecting an output node to ground, and another path consisting of a pair of series-connected N-channel transistors connecting the node to ground; the lower of these is driven by the logic voltage which is applied to the gate of the pull-down, and the other has its gate connected to the output node. Two parallel discharge paths are thus provided for the output node, one through the small pull-down transistor, and a second through the (larger) series transistors. When a returning wave from the output node (due to transmission line effects) hits the driver circuit, the series transistors turn off, but the pull-down transistor is still on keeping the driver output node at a valid "low." In cases of mismatch or noise, the pull-down transistor will help absorb refections or ringing. This output driver is especially adapted for small transistor sizes, producing transmission line effects at the chip-to-bus interface, because the circuitry controls overshoot and undershoot, but yet does not use on-chip series source terminations or external (off-chip) terminations). The driver circuit is less sensitive to process and temperature variations, and also less sensitive to variations in etched-conductor impedance, so is capable of driving from either the middle or end of the etched-conductor with no degradation in performance.

19 Claims, 1 Drawing Sheet

HIGH-SPEED, LOW-NOISE, CMOS OUTPUT DRIVER

BACKGROUND OF THE INVENTION

This invention relates to semiconductor integrated circuit devices, and more particularly to output drivers for CMOS integrated circuits.

In my U.S. Pat. No. 4,963,766, assigned to Digital Equipment Corporation, a CMOS driver circuit is shown which is of the type used as an output buffer in a single-chip microprocessor or memory circuit. A driver of this type is used to convert a logic voltage within the chip to a higher-level signal for driving a bus on a printed circuit board or other connection between chips. The circuit of Pat. No. 4,963,766 is adapted to be powered by a low-voltage supply, e.g., 3.3 v., but yet is able to withstand higher voltages imposed on its output node. A P-channel pull-up transistor is employed, and the N-well of this pull-up transistor is connected to a higher-level voltage supply, 5.0-volts.

As CMOS feature sizes continue to shrink, the resulting device speed has continually improved. Faster rise and fall times incident to these faster device speeds results in the etched-circuit conductors of a module changing from an RC-dominated environment to an LC or transmission line environment. An etch-conductor with its grounded plane, usually found in a circuit board, forms a transmission line at the frequencies present in logic voltages having fast rise and fall times. A transmission line environment requires that the driver, etched-conductor, and loading be carefully analyzed to ensure that transmission line effects such as overshoot, undershoot, and ringing do not impact data transfers.

One prior solution to the problems of the transmission line environment is to use series-source terminations on the chip. That is, a resistor is placed in series with the signal source, so the resistor appears in series between the output pad and the driver transistor. The resistor should match the impedance $Z_O$ of the transmission line appearing at the chip output. However, a series source termination is usually optimized for etched-conductor impedance, loading, and driver position on the etch (end or middle). Both the resistor (a diffusion) and the NMOS pull-down transistor are subject to process variations in manufacture and temperature variations in operation. It is thus desirable to find a solution that is more independent of these parameters.

SUMMARY OF THE INVENTION

According to one embodiment of the invention, an output driver of the type especially adapted for small device sizes, producing transmission line effects at the chip-to-bus interface, uses circuitry to control overshoot and undershoot without the use of on-chip series source terminations or external (off-chip) terminations. This circuitry is less sensitive to process and temperature variations. Also it is less sensitive to variations in etched-conductor impedance and is capable of driving from either the middle or end of the etched-conductor with no degradation in performance.

In accordance with an example embodiment, a driver circuit employs an N-channel pull-down transistor of relatively small size, directly connecting an output node to ground, and another path consisting of a pair of series-connected N-channel transistors connecting the node to ground; the lower of these is driven by the logic voltage which is applied to the gate of the pull-down, and the other has its gate connected to the output node. Two parallel discharge paths are thus provided for the output node, one through the small pull-down transistor, and a second through the (larger) series transistors. When a returning wave from the output node (due to transmission line effects) hits the driver circuit, the series transistors turn off, but the pull-down transistor is still on, keeping the driver output node at a valid "low." In cases of mismatch or noise, the pull-down transistor will help absorb refections or ringing.

BRIEF DESCRIPTION OF THE DRAWINGS

The novel features believed characteristic of the invention are set forth in the appended claims. The invention itself, however, as well as other features and advantages thereof, will be best understood by reference to the detailed description of a specific embodiment, when read in conjunction with the accompanying drawings, wherein:

DETAILED DESCRIPTION OF SPECIFIC EMBODIMENT

Figure 1:
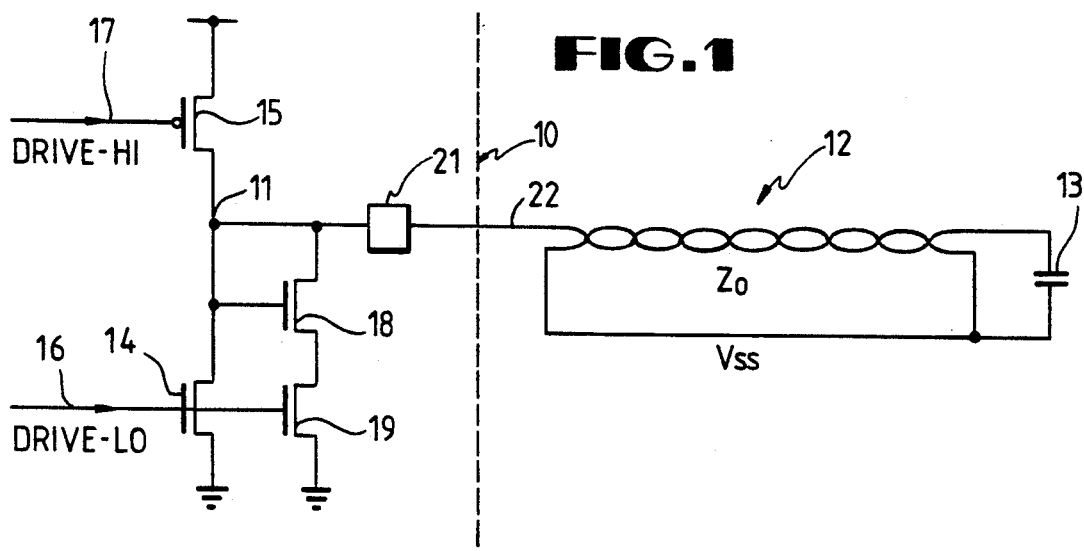
FIG. 1 is an electrical diagram of an output buffer circuit according to one embodiment of the invention.

Referring to FIG. 1, an output buffer circuit on an integrated circuit chip 10 is shown having an output node 11 connected to a load that resembles a transmission line 12 and a capacitance 13, referenced to Vss. An NMOS pull-down transistor 14 connects the output node 11 to Vss on the chip, and a PMOS pull-up transistor 15 connects the node 11 to Vdd, in the usual manner. The logic voltage is applied to the output pull-up and pull-down devices as drive-lo and drive-hi voltages on lines 16 and 17. According to this embodiment of the invention, two additional NMOS pull-down devices 18 and 19 are added. The gate of the transistor 19 is driven by the drive-lo voltage on line 16, and the gate of the transistor 18 is driven by the output node 11. In operation, with the output node 11 initialized to a logic high level, Vdd, the drive-lo voltage on line 16 is asserted and these transistors 14, 18 and 19 will pull-down (discharge) the output node 11 to Vss. There are two parallel discharge paths. The first is through the pull-down transistor 14 which is configured as a normal output pull-down device, i.e., with drain connected to the output node 11, source connected to Vss, and gate connected to the signal drive-lo. The size of transistor 14 is relatively small, and it is used essentially to keep the output voltage at a valid "low" level and absorb refections. The second discharge path is through the NMOS transistor 18 in series with the NMOS transistor 19. Both of these transistors 18 and 19 are large devices, providing the initial drive capability. The transistor 19 is used simply as an enable/disable for the transistor 18. The transistor 18 has both its drain and gate connected to the output node 11. Both the DC and AC responses of this circuit are considered in interpreting the operation.

Figure 2:
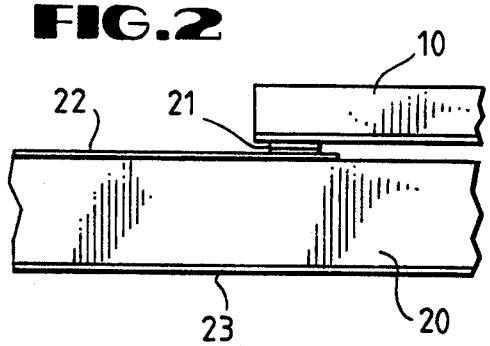
FIG. 2 is a section view of a part of a semiconductor chip mounted on a circuit board, showing how the circuit of FIG. 1 is connected to a transmission line type of output.

Referring to FIG. 2, the semiconductor chip 10 having the circuit of FIG. 1 formed therein (as an output driver for a memory or microprocessor, for example) is shown mounted on an etched-circuit board 20. The output node 11 is connected by a bonding pad 21 to an etched conductor 22 forming a transmission-line-like structure with the apparent impedance $Z_o$ including inductor 12 and capacitor 13. A planar conductor 23 (or ground plane) is separated from the etched conductor 22 by the dielectric of the board 20, creating the equivalent of a transmission line at these frequencies.

Figure 3:
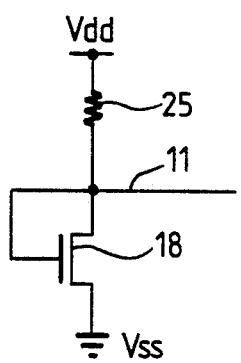
FIG. 3 is an electrical diagram of an equivalent for the circuit of FIG. 1 for a DC mode of operation.

The DC operation of the transistor 18 is represented by the circuit of FIG. 3. In a DC analysis, the resistor 25 represents the etched-conductor impedance of the module (as if the etched-conductor were infinitely long). The NMOS transistor 18 is sized such that the output node 11 will be at approximately Vdd/2. The circuit has negative feedback. If the current through the transistor 18 were to incrementally increase by "di", the drain voltage of the transistor 18 will decrease by Z*di. Since Vds=Vgs (drain-to-source voltage equals gate-to-source voltage) for this transistor 18, a corresponding decrease in current results. Parameters that would normally affect the current through this transistor 18 (e.g., temperature, process variations, etc.) are thus stabilized to a degree.

The AC behavior of the circuit of FIG. 1, is now considered. Initially the output node 11 is high, at Vdd. As the drive-lo voltage goes high (is asserted) the driver will send an incident wave into the transmission line. The magnitude of the incident wave is essentially the same as the DC response of the FIG. 3 circuit; with proper sizing, at or about Vdd/2 (transistor 14 is a small device, thus overall its impact may be considered small). The incident wave travels to the high impedance load where, due to transmission line effects, it doubles in amplitude, returning a wave (of magnitude Vdd/2) to the driver circuit of chip 10. When the returning wave hits the driver, the NMOS transistor 18 turns off since Vds (=Vgs) is now less than the NMOS threshold. The NMOS transistor 14 is still on (its gate is fully asserted by drive-lo) keeping the driver output node at a valid "low." In cases of mismatch or noise, the transistor 14 will help absorb refections or ringing.

Figure 4:
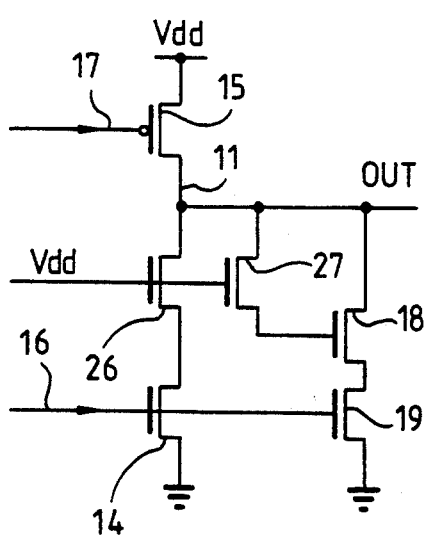
FIG. 4 is an electrical diagram of an output buffer circuit as in FIG. 1 according to another embodiment of the invention.

Another embodiment of the circuit of the invention is shown in FIG. 4. The NMOS transistors 14, 18, and 19 are generally the same as in the circuit of FIG. 1, but the transistor 14 is connected to the output node 11 through an NMOS transistor 26, while the gate of the transistor 18 is connected to the node 11 through another NMOS transistor 27. The purpose of these additional transistors 26 and 27 is to make the driver circuit tolerant of 5 V levels on the output node 11. The transistor 26 protects the transistor 14 from hot carrier effects due to elevated voltages, while the transistor 27 similarly protects the transistor 19. When the supply voltage Vdd is of the 3.3 V. level, and the transistors are of small geometry, but yet the chip 10 is driving a bus that has other devices connected to it using 5 V supply voltages and signal levels, the higher voltage will appear on the input 11. The circuit of FIG. 4 is to avoid the hot carrier effects on the transistors 14 and 19 caused by such overvoltages on the output 11.

Figure 5:
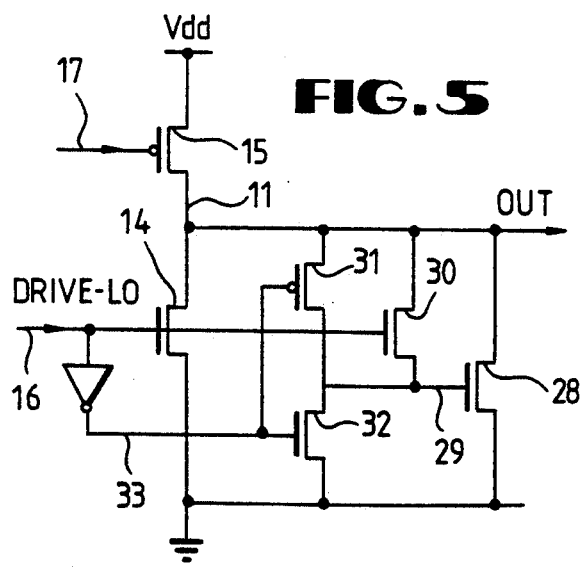
FIG. 5 is an electrical diagram of an output buffer circuit as in FIG. 1 according to yet another embodiment of the invention.

Still another embodiment of the invention is illustrated in FIG. 5. This circuit is a higher performance version of the circuit of FIG. 1, but does not have the 5 V tolerance of the circuit of FIG. 4. Here the N-channel pull-down transistor 14 (as in FIG. 1) is connected directly between the output node 11 and Vss, with its gate driven by drive-lo on line 16 as before. A transistor 28 (corresponding to the transistor 18 of FIG. 1) is connected between the output node 11 and Vss, and has its gate 29 connected to the output node 11 through an N-channel pass transistor 30, which also has its gate driven by drive-lo from line 16, and a P-channel pass transistor 31 which is driven by drive-lo-bar on line 33. Before drive-lo is asserted (also in Z-state or when driving high), drive-lo bar is high and transistor 32 is turned on, holding the gate 29 at Vss and holding the transistor 28 off. When drive-lo is asserted (goes to Vdd), drive-lo bar goes to Vss, turning off the transistor 32 and turning on the transistor 31, so both transistors 30 and 31 charge the gate 29, turning on the transistor 28 (which is larger than transistor 14) at a faster rate. The circuit of FIG. 5 benefits from not requiring a large series NMOS device (transistor 19 of FIG. 1) to enable/disable the transistor 28 (corresponding to transistor 18); therefore the transistor 28 can be much smaller. Note, further, that charge from the output capacitance 13 is used to turn on the transistor 28.

When driving from the end of the etched-conductor of a module, a driver sees an impedance $Z_o$; from the middle of the etched-conductor the driver sees $Z_o/2$. A normal push-pull driver circuit as previously used was ordinarily optimized (sized) to control overshoot when driving from the end, and was not capable of driving from the middle of the etched-conductor path without incurring the penalty of an additional round trip transmission line delay. The driver circuit of the invention is less sensitive to worst-case parameters, making it feasible to optimize the circuit such that the driver is capable of both driving from the end or middle of the etched-conductor. This is accomplished by sizing the circuit to be slightly underdamped when driving from the end of the etched-conductor, and to be slightly overdamped when driving from the middle of the etched-conductor.

The output buffer according to the invention offers a high-performance solution with less dependency on worst-case parameters. It can thus be optimized to higher performance than prior circuits, translating directly into CPU performance gains for a system bound by I/O speed.

While the invention has been described with reference to a specific embodiment, the description is not meant to be construed in a limiting sense. Various modifications of the disclosed embodiment, as well as other embodiments of the invention, will be apparent to persons skilled in the art upon reference to this description. It is therefore contemplated that the appended claims will cover any such modifications or embodiments which fall within the true scope of the invention.

What is claimed is:

1. An output circuit, comprising:
   a) a first pull-down transistor and a pull-up transistor, each of said transistors having a source-to-drain path and a gate; the source-to-drain path of said pull-up transistor being connected between one terminal of a voltage supply and an output node; the source-to-drain path of said first pull-down transistor being connected between another terminal of said voltage supply and said output node;
   b) a second pull-down transistor and a series transistor, each of said transistors having a source-todrain path and a gate; the source-to-drain paths of said second pull-down transistor and said series transistor being connected in series between another terminal of said voltage supply and said output node; the gates of said first and second pull-down transistors being connected to a logic voltage driver; the gate of said series transistor being connected to said output node; said first pull-down transistor being smaller than said second pull-down transistor.

2. A circuit according to claim 1 wherein said first and second pull-down transistors and said series transistor are of the same channel conductivity type.

3. A circuit according to claim 2 wherein said pull-up transistor is of the opposite channel conductivity type.

4. A circuit according to claim 3 wherein said one channel conductivity type is N-channel.

5. A circuit according to claim 4 wherein said one terminal of said supply is positive and said another terminal is ground.

6. A circuit according to claim 5 wherein said output node is connected to an output conductor having transmission line qualities.

7. An output circuit, comprising:
a) a first pull-down transistor and a pull-up transistor, each of said transistors having a source-to-drain path and a gate; the source-to-drain path of said pull-up transistor being connected between another terminal of a voltage supply and an output node; the source-to-drain path of said first pull-down transistor being connected between another terminal of said voltage supply and said output node; the gate of said first pull-down transistor being connected to a logic voltage driver;
b) a second pull-down transistor having a source-to-drain path and a gate; the source-to-drain path of said second pull-down transistor being connected between another terminal of said voltage supply and said output node; said first pull-down transistor being smaller than said second pull-down transistor;
c) a pair of complementary transistors having source-to-drain paths connected at a source-to-drain path series connection point and in series between said output node and said another terminal of said supply, the gates of said complementary transistors being connected to an inverse of said logic voltage driver, said source-to-drain path series connection point connected to the gate of said second pull-down transistor; and
d) a pass transistor having a source-to-drain path connected between said output node and the gate of said second pull-down transistor and having a gate connected to said logic voltage driver.

8. A circuit according to claim 7 wherein said first and second pull-down transistors and said pass transistor are of the same channel conductivity type.

9. A circuit according to claim 8 wherein said pull-up transistor is of the opposite channel conductivity type.

10. A circuit according to claim 8 wherein said same channel conductivity type is N-channel.

11. A circuit according to claim 10 wherein said one terminal of said supply is positive and said other terminal is ground.

12. A circuit according to claim 11 wherein said output node is connected to an output line having transmission line qualities.

13. A circuit according to claim 12 wherein said complementary transistors include a P-channel transistor having its source-to-drain path connected to said output node.

14. An output circuit, comprising:
a) a first pull-down transistor, a first series transistor, and a pull-up transistor; each of said transistors having a source-to-drain path and a gate; the source-to-drain path of said pull-up transistor being connected between one terminal of a voltage supply and an output node; the source-to-drain paths of said first series transistor and said first pull-down transistor being connected in series between said output node and another terminal of said voltage supply; the gate of said first series transistor being connected to said one terminal of said supply;
b) a second pull-down transistor, a second series transistor, and a coupling transistor, each of said transistors having a source-to-drain path and a gate; the source-to-drain paths of said second pull-down transistor and said second series transistor being connected in series between another terminal of said voltage supply and said output node; the gates of said first and second pull-down transistors being connected to a logic voltage driver; the gate of said second series transistor being connected to said output node through the source-to-drain path of said coupling transistor; the gate of said coupling transistor being connected to said one terminal of said supply; said first pull-down transistor being smaller than said second pull-down transistor.

15. A circuit according to claim 14 wherein said first and second pull-down transistors and said first and second series transistors are of the same channel conductivity type.

16. A circuit according to claim 15 wherein said pull-up transistor is of the opposite channel conductivity type.

17. A circuit according to claim 15 wherein said one channel conductivity type is N-channel.

18. A circuit according to claim 17 wherein said one terminal of said supply is positive and said another terminal is ground.

19. A circuit according to claim 18 wherein said output node is connected to an output line having transmission line qualities.

* * * * *